United States Patent [19]

Menadier et al.

[11] Patent Number: 5,027,433

[45] Date of Patent: Jun. 25, 1991

[54] REMOTE INFRARED TRANSCEIVER AND METHOD OF USING SAME

[75] Inventors: Michael A. Menadier, Vista; Michael A. Williams; David B. Rose, both of San Diego, all of Calif.

[73] Assignee: HM Electronics, Inc., San Diego, Calif.

[21] Appl. No.: 427,650

[22] Filed: Oct. 27, 1989

Related U.S. Application Data

[63] Continuation-in-part of Ser. No. 326,225, Mar. 20, 1989, which is a continuation-in-part of Ser. No. 176,939, Apr. 4, 1988, abandoned, and a continuation-in-part of Ser. No. 427,690, Oct. 27, 1989.

[51] Int. Cl.⁵ .............................................. H04B 10/00
[52] U.S. Cl. .................................... 455/606; 455/601
[58] Field of Search ............... 455/601, 600, 603, 606, 455/607, 613; 357/19

[56] References Cited

U.S. PATENT DOCUMENTS

| | | | |
|---|---|---|---|
| 2,404,696 | 7/1946 | Deal | 455/607 |
| 4,516,221 | 5/1985 | Nakata et al. | 455/607 |
| 4,648,131 | 3/1987 | Kawaguchi et al. | 455/606 |
| 4,717,913 | 1/1988 | Elger | 455/606 |
| 4,814,742 | 3/1989 | Morita et al. | 455/607 |
| 4,882,770 | 11/1989 | Miyahira et al. | 455/603 |

FOREIGN PATENT DOCUMENTS

| | | | |
|---|---|---|---|
| 2431937 | 1/1976 | Fed. Rep. of Germany | 455/607 |
| 2823931 | 1/1981 | Fed. Rep. of Germany | 455/606 |
| 8906459 | 7/1989 | World Int. Prop. O. | 455/601 |

*Primary Examiner*—Reinhard J. Eisenzopf
*Assistant Examiner*—Kinfe-Michael Negash
*Attorney, Agent, or Firm*—Bernard L. Kleinke; William P. Waters; Jerry R. Potts

[57] ABSTRACT

The optical transceiver includes a headset antenna assembly, which is adapted to be worn on the head of the user, and which is connected electrically by a cable to a transceiver unit adapted to be worn on the belt of the user. The headset antenna assembly includes a set of alternating light emitting diodes and photosensitive diodes which are disposed on the antenna assembly to transmit and receive optical signals about a substantially 360 degree radial axis. The light emitting diodes are inclined upwardly from a horizontal plane to help avoid obstructions. Baffles are disposed between the diodes to reduce feedback interface, and a circuit in the transceiver unit discriminates against background light.

19 Claims, 4 Drawing Sheets

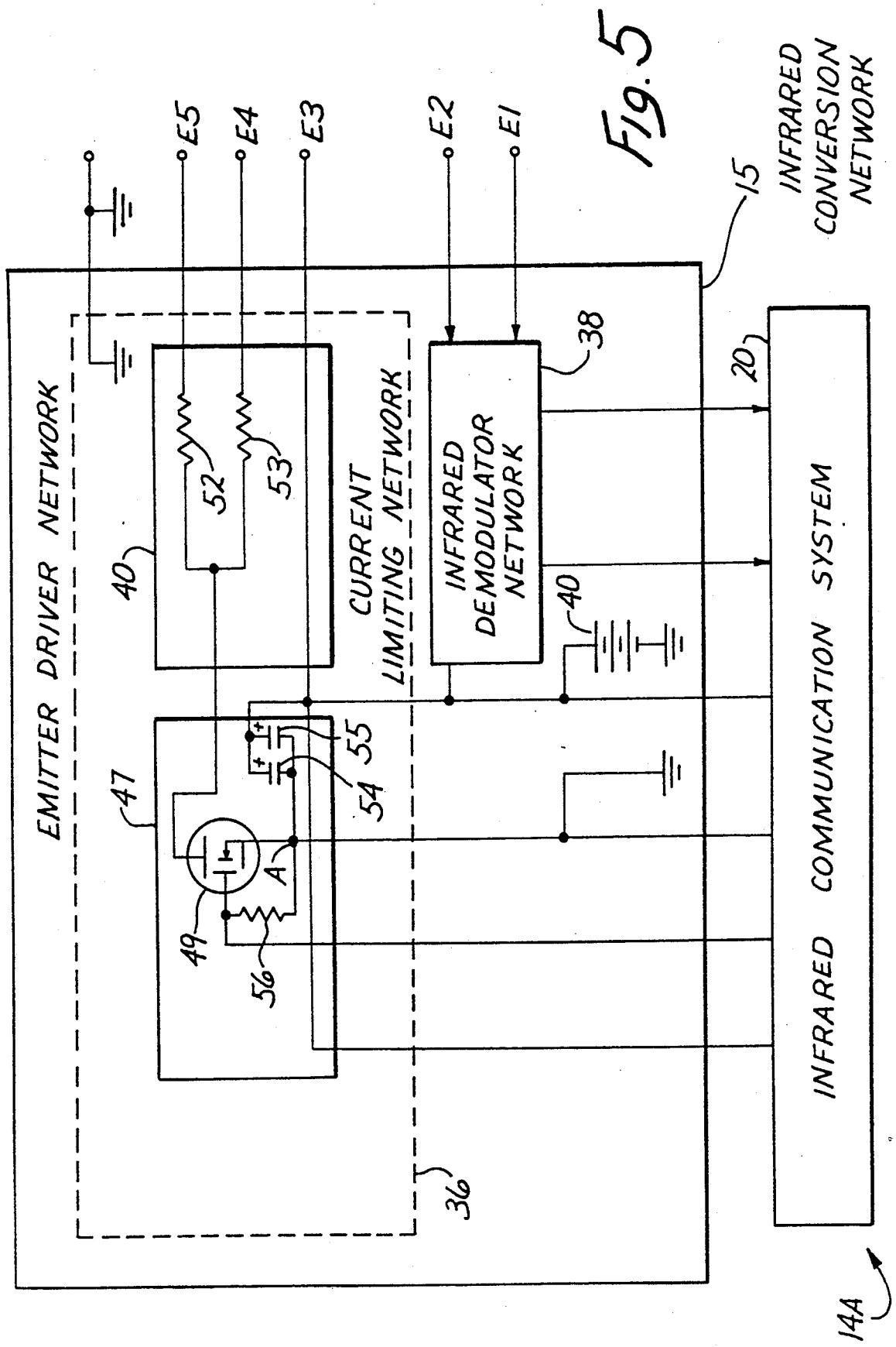

REMOTE INFRARED TRANSCEIVER AND METHOD OF USING SAME

CROSS REFERENCE TO RELATED APPLICATION

This application is a continuation-in-part of U.S. patent application Ser. No. 07/326,225 filed Mar. 20, 1989 which is a continuation-in-part of now abandoned U.S. patent application Ser. No. 07/176,939 filed Apr. 4, 1988, and is a continuation-in-part of U.S. patent application Ser. No. 07/427,690, filed Oct. 27, 1989, entitled "FULL DUPLEX COMMUNICATION SYSTEM AND METHOD OF USING SAME", said applications being assigned to the same assignee and being incorporated herein by reference.

DESCRIPTION

1. Technical Field

The present invention relates, in general, to an optical transceiver for a full duplex communication system, and method of using the transceiver. The present invention more particularly relates to a portable optical transceiver, which is adapted to be used indoors for a variety of purposes, such as restaurants, factories, offices and others.

2. Background Art

Optical wavelength communication systems are highly desirable for use in many different applications. Such systems, especially relatively inexpensive ones, can be used to replace conventional radio frequency systems, such as those used in fast food restaurants, since the optical wavelength communication does not require special government licenses, and are more tolerant of noise interference. For example, short range optical wavelength carrier communication systems are disclosed in the foregoing mentioned co-pending U.S. patent applications, where each optical wavelength communication system enables full duplex communication between two or more transceivers.

In at least one of the systems disclosed in the foregoing mentioned co-pending applications, both remote and stationary repeating base station transceivers can communicate simultaneously with one another over optical wavelength carriers in a full duplex mode of operation. In this regard, the stationary transceiver is employed to repeat messages from one remote transceiver to another remote transceiver.

Since the transceivers employ lightwave carriers, both transceivers must be disposed in direct line of sight communication relative to one another. While such optical wavelength carrier systems may be extremely useful for many applications, it would be highly desirable to have an optical wavelength communication system, which enables at least some of the remote transceivers to be carried from place to place within the same room, and still remain in direct line-of-sight optical communication.

Thus, it would be highly desirable to have a full duplex optical wavelength carrier communication system which could transmit and receive signals to and from a portable remote transceiver carried or moved within a large room during the course of transmitting and receiving optical carrier signals.

Since optical communication systems, such as infrared systems, are founded on a direct line of sight basis, it has been difficult, if not impossible, to have a remote optical transceiver that could permit a user to communicate with only a single stationary base station transceiver, as the user moves about in a given geographical area. For example, the lightwave carrier signals generated from the remote transceiver must be capable of being received by the base antenna system for repeating purposes, regardless of various obstructions which may be interposed within the transmission area. Accordingly, such obstructions can interfere with the optical communication.

Therefore, it would be highly desirable to have an new and improved portable optical transceiver, forming a part of an optical communication system, which would substantially eliminate, or at least greatly reduce, the obstruction problems associated with a direct line optical communication path, between a portable transceiver and a stationary fixed base station optical transceiver. In this regard, such a new transceiver should facilitate optical communications, even though the communication system is a low cost, full duplex system, such as the ones disclosed in the foregoing mentioned co-pending applications.

Such a transceiver should be able to be used by a person in a convenient manner, even while carrying out the functions of his or her work. Such functions may include moving about rapidly, from place to place, within a large room. Such tasks may include bending over, sitting, standing, and a variety of other physical movements throughout the normal performance of ones duties.

During all such maneuvers, the improved optical transceiver should remain in substantial continuous line of sight communication with the stationary repeating transceiver. This will enable the worker to be able to communicate with other workers, with little or no unwanted interruptions in such communications, while the workers perform their assigned tasks.

In such a communication system, it is important for the remote transceiver to generate a sufficient amount of optical energy to permit the transceivers to be operated satisfactorily, even in bright day light, or in bright artificial light, conditions. In this regard, in the normal working environment, such as in a fast food restaurant, personnel must have adequate light to carry out normal working tasks. However, in such a bright ambient light it tends to be difficult to discriminate the communication signals from the background light.

Therefore, it would be highly desirable to have an optical communication transceiver and method of using the same, to facilitate the receiving and transmitting of infrared communication signals, between a portable infrared transceiver and a base station transceiver, while being used in a brightly lighted area and from substantially any location within a given geographical area.

Another problem associated with optical systems has been interference caused by the optical feedback between the emitters and receptors of the same transmitter. In this regard, such interference should be obviated in a low cost manner, and yet such a low cost transceiver should be useful in brightly lighted rooms.

SUMMARY OF INVENTION

Therefore, it would be highly desirable to have a new and improved relatively low cost optical transceiver and method of using it, to facilitate continuous communication between like units, in a full duplex manner.

Briefly, the above and further objects of the present invention are realized by providing a new and improved optical transceiver and method of using it to transmit and receive optical wavelength carrier signals to and from a stationary base station transceiver, in a substantially continuous manner.

The optical transceiver includes a headset antenna assembly, which is adapted to be worn on the head of the user, and which is connected electrically by a cable to a transceiver unit adapted to be worn on the belt of the user. The headset antenna assembly includes a set of alternating light emitting diodes and photosensitive diodes which are disposed on the antenna assembly to transmit and receive optical signals about a substantially 360 degree radial axis. The light emitting diodes are inclined upwardly from a horizontal plane to help avoid obstructions. Baffles are disposed between the diodes to reduce feedback interface, and a circuit in the transceiver unit discriminates against background light.

The headset antenna assembly is attached to the head of a user, and the antenna is connected to the remote transceiver unit which is also worn by the user. When transmission is initiated, the antenna assembly generates a transmission/reception lobe of a sufficient size and sufficient quantity of optical energy so that optical communication with the base station transceiver is achieved from substantially any locale within a given working area, with little or no interruption as the user moves about performing his or her tasks.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 5 is a block diagram of a transceiver unit of the transceiver of FIG. 2.

THE BEST MODE FOR CARRYING OUT THE INVENTION

Figure 1:
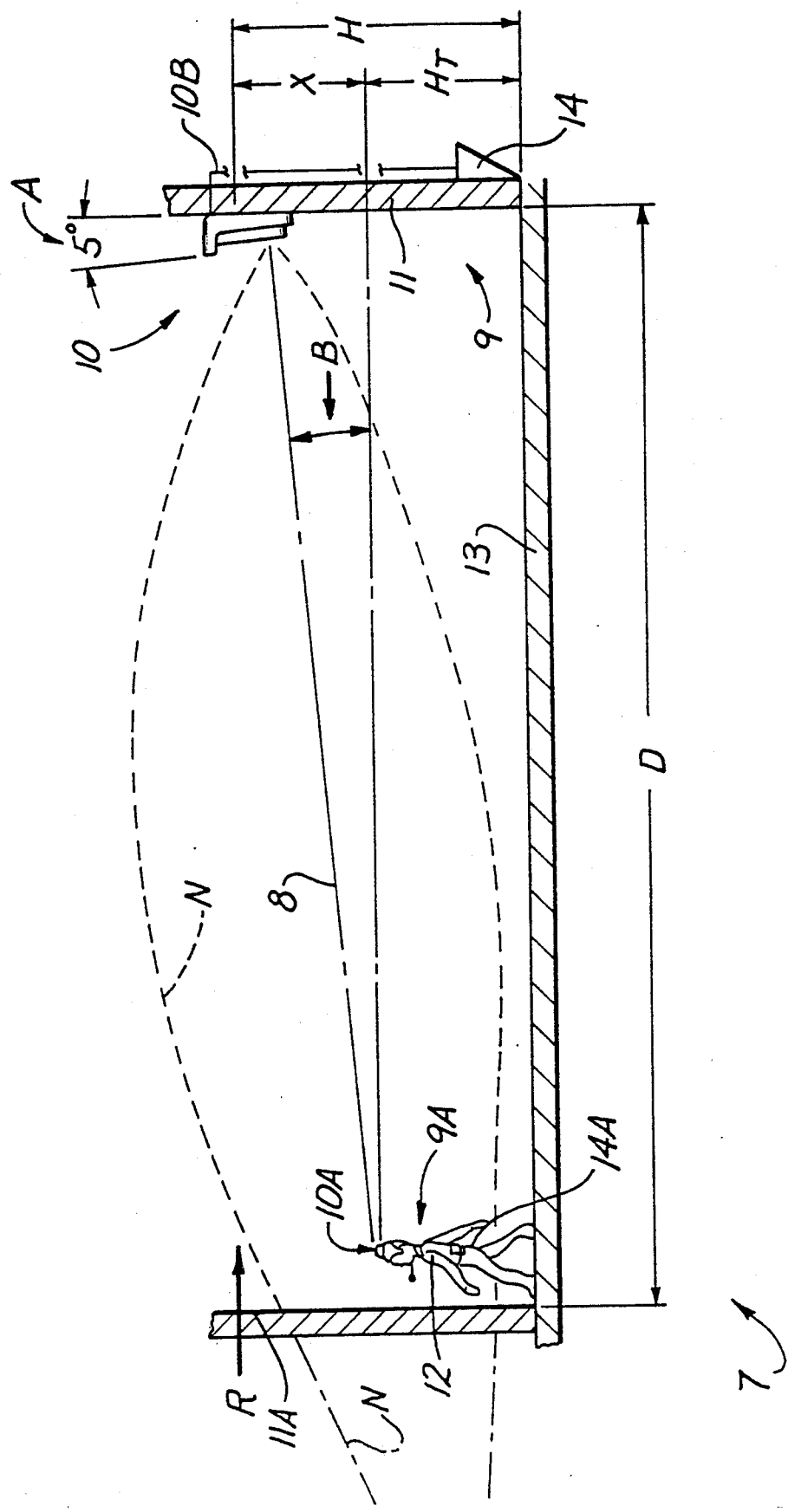
FIG. 1 is a diagrammatic view of an optical communication system, including one of the remote portable transceivers, which is constructed according to the present invention.

Referring now to the drawings, and more particularly to FIG. 1 thereof, there is illustrated a full duplex infrared communication system 7, which is constructed in accordance with the present invention, and which is adapted to be used within a large, open room R. The communication system 7 generally comprises a portable remote transceiver generally indicated at 9A for communicating with a single base station transceiver, such as the transceiver 9, for infrared communication therebetween. The base station transceiver 9 is a repeating transceiver to enable a user 12 to communicate by the portable remote transceiver 9A to other persons (not shown) wearing like remote transceivers (not shown).

The foregoing mentioned co-pending applications Ser. No. 07/176,939 and 07/326,225 disclose, in greater detail, the operation of the infrared communication system. In co-pending U.S. patent application Ser. No. 07/427,690, filed Oct. 27, 1989, there is disclosed in greater detail, the base station transceiver 9.

The portable remote transceiver 9A generally comprises a headset antenna assembly 10A worn on the head of the user 12. The headset antenna assembly 10A is connected electrically to a remote transceiver unit 14A, also worn by the user 12, for permitting infrared communication with the base station transceiver 9. The unit 14A may, for example, be worn at the waist of the user, and may be attached thereto, by means (not shown). The remote transceiver unit 14A includes the electronic circuits of a remote transceiver as hereinafter described in greater detail.

The portable remote transceiver 9A performs two functions: (1) it transmits modulated infrared optical wavelength carrier signals to a stationary base station transceiver 9, and (2) it receives modulated infrared optical wavelength carrier signals from the stationary base station transceiver 9. In this regard, the portable remote transceiver 9A receives infrared signals from the stationary base station transceiver 9 and converts these signals to electrical signals for use by the infrared communication system 20, or conversely, it receives electrical signals from the infrared communication system 20 and converts these signals into modulated optical wavelength carrier signals for transmission to the stationary base station transceiver 9. The transceiver 9, in turn, repeats such optical communication with other like remote transceivers (not shown), which are similar to the remote transceiver 9A.

Figures 2, 3:
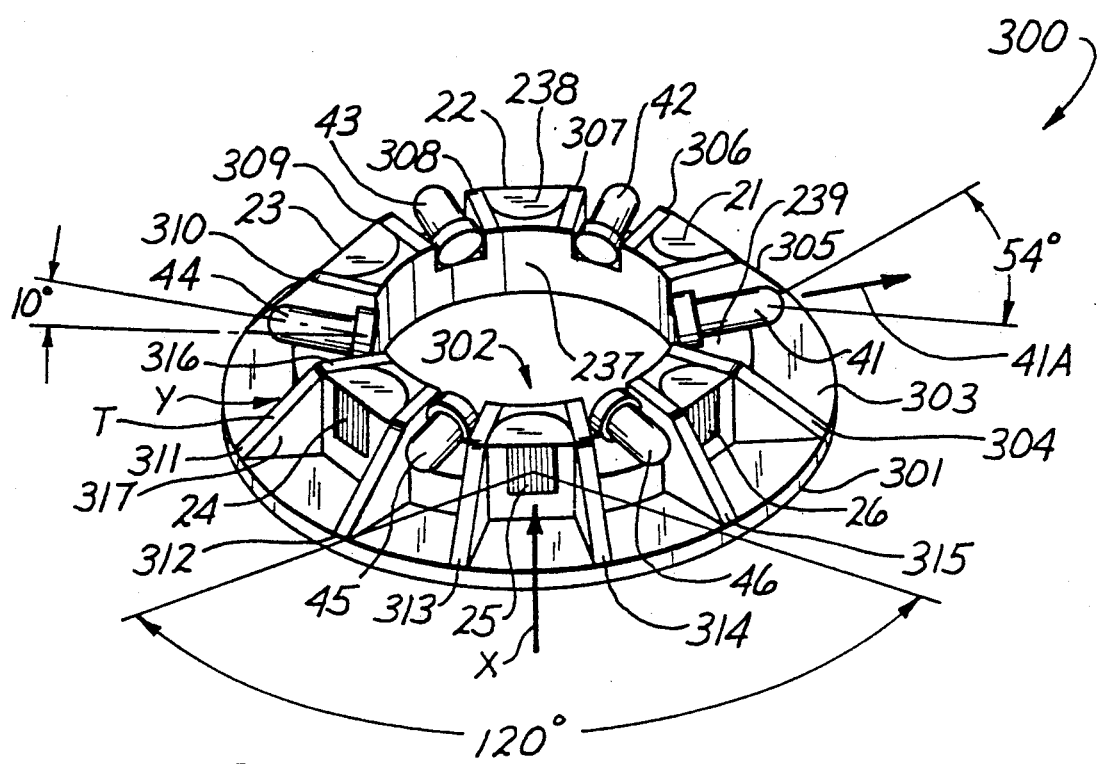
FIG. 2 is a greatly enlarged pictorial view, shown partially diagrammatically, of the remote transceiver of FIG. 1.
FIG. 3 is an enlarged pictorial view of an infrared antenna of the transceiver of FIG. 1.

Considering now the headset antenna assembly 10A in greater detail with reference to FIGS. 2-3, the headset antenna assembly 10A generally comprises an infrared antenna unit 300 for transmitting and receiving infrared carrier signals and a headset 200 for mounting the infrared antenna unit 300 to the head of a user. The infrared antenna unit 300 is connected electrically to the remote transceiver unit 14A by a cable 100. The remote transceiver until 14A will be described hereinafter in greater detail.

The infrared antenna unit 300 in cooperation with the remote transceiver unit 14A, simultaneously transmits and receives infrared lightwave carrier signals, to and from the base station transceiver 9. In this regard, the infrared antenna unit 300 includes an emitter diode array 16 and a receptor diode array 18. The emitter diode array 16 transmits infrared lightwave carrier signals, while the receptor diode array 18 receives infrared lightwave carrier signals. Transmission and reception of the infrared carrier signals in accomplished in a full duplex mode of operation to permit the simultaneous transmission and reception of the optical carrier signals.

Considering now the headset 200 in greater detail with reference to FIGS. 2-3, the headset 300 generally comprises an arcuate substantially semi-circularly shaped headband or bow 212, for fitting over, and overlaying the crown of a head of the user. The headset 200 also includes an earpiece assembly 214 mounted on one end 226 of the headband 212 for engaging the ear (not shown) of the user, and for housing a speaker (not shown). A boom 236 is connected rotatably to the earpiece assembly 214, and supports a microphone 218, at a desired predetermined distance from the user's mouth (not shown). The headband 212 terminates at its other substantially diametrically opposite end 228 in a temple piece 220, for engaging the user's temple (not shown).

Therefore, when the headband 212 is positioned over the user's crown, the earpiece assembly 214 engages the ear of the user while the temple piece 220 engages the user's opposed temple. The remote transceiver unit 14A is connected electrically to the microphone 218 and earpiece assembly 214 through a cable 100A which is an integral part of cable 100 via a connector (not shown). The remote transceiver unit 14A is generally carried in a remote location relatively to the headband 212, such as on the user's belt.

The headband 212 generally includes an accurate headpiece member 212A and an accurate inner member or band 212B. The outer member 212A has a similar curve feature as the inner member 212B and is secured in overlay relationship therewith. The members 212A and 212B are made of a compliant, resilient thermoplastic rubber material, such as the material sold under the name Santoprene. The boom 236 is mounted to be rotatable continuously and freely through 360 degrees about the axis of the earpiece assembly 214.

In use, the headset 200 is placed on the head, by flexing the headband 212 outwardly, and by placing the inner member 212B on the crown. The overall length of the headband 212 is then adjusted by plastic guides (not shown). Next, the earpiece assembly 214 is engaged with the user's ear, and the headband 212 is released, to cause the temple piece 220 to press against the user's temple. The microphone boom 236 is then rotated about a axis for positioning and adjusting the microphone 218 in front of the user's mouth.

Considering the headpiece member 212B in greater detail with reference to FIG. 2, the headpiece member is generally of a unitary construction having a body portion 240 and a top portion 241. The top portion 241 is generally circular and includes a recessed circular opening which is adapted to receive the antenna unit 300 and a antenna cover 242. The antenna unit 300 is mounted within the recessed area by a set of mounting screw (not shown) and is covered by the antenna cover 242 which protects the diode arrays disposed on the antenna unit from dirt and other contaminating materials.

Considering now the antenna unit 300 in greater detail with reference to FIG. 3, the antenna unit 300 generally comprises an annular base portion 301 having a centrally disposed opening 302. The base portion 301 includes an upper surface 303 that has a set of like integrally connected upright baffles or walls 304–315 which extend radially and are equally spaced apart circumferentially on the circular base portion 301. Each upright wall, such as wall 304, extends upwardly and perpendicularly from the upper surface 303 and includes a rear portion and a front portion, such as rear portion 316 and front portion 317 of the wall 311. Each wall, such as the wall 311, terminates in an upstanding interconnecting annular rear wall 237 which encircles and defines the circular opening 302. The rear wall 237 is adapted to receive a set of diode holder, such as holder 238 and 239.

The diode holders, such as diode holder 238, are adapted to receive the individual photo sensitive diodes of the receptor network 16, while the diode holders, such as holder 239, are adapted to receive the individual light emitting diodes of the emitter network 18. As best seen in FIG. 3, the diode holders for the light emitting diodes of the emitter network 18, when received within rear wall 237, cause each diode cf the emitter diode network to be inclined upwardly at approximately ten degree from the horizontal. In this manner, any possible obstruction of the diodes, due, for example, to the hair (not shown) of the user 12 (FIG. 1) is greatly reduced, if not completely eliminated. The diode holders for the light emitting diodes are also disposed in such a manner between the wall such as wall 312 and 313, to block substantially the infrared light emitted from the diode disposed in such holders from being received by any one of the photosensitive diodes mounted on the antenna assembly 229, thereby preventing, or at least inhibiting feedback interference.

Thus, the unit 300 includes an array or set of infrared light emitting diodes and a set of receptor photodiodes. The infrared light emitting diodes and the receptor diodes alternate, and are arranged on the base 301 in an annular configuration. The diodes are mounted at the upstanding rear annular wall 237. The emitter diodes, such as the diode 41, have radially outwardly extending peak power axes, such as the axis 41A, and have lobes or half power radiant cones thereabout, such as the lobe about the axis 41A, of approximately 54 degrees.

The receptor diodes, such as the receptor diode 25, nodes or cones, have outwardly radially extending reception axis, such as the axis X. The receptor diodes, such as the diode 25, have lobes or half power radiant cones such as the lobe surrounding the axis X, of about 120 degrees.

Each one of the walls, such as the wall Y, is disposed between a pair of emitter and receptor diodes, such as the emitter diode 41 and the receptor diode 25, on opposite sides of the wall Y. Thus, the walls serve as baffles between the emitter and receptor diodes to help prevent feedback interferences.

Each one of the walls, such as the wall Y, includes a generally rectangular rear portion, such as the portion 316, integrally connected to and extending radially outwardly therefrom. Each one of the walls also include a generally triangular front portion, such as the portion 317 integrally joined to the rear portion 316. The front portion 317 has a top edge T, which slopes downwardly at its rear end at the rear portion 316 to the base 303 at its outer circumferential edge. It should be noted that the diodes are positioned between the baffle walls, spaced by a substantial distance from the outer edge of the base.

Each one of the emitter diodes, such as the diode 42, has its rear end positioned within an open notch, such as the notch N, in the rear wall 237.

Figure 4:
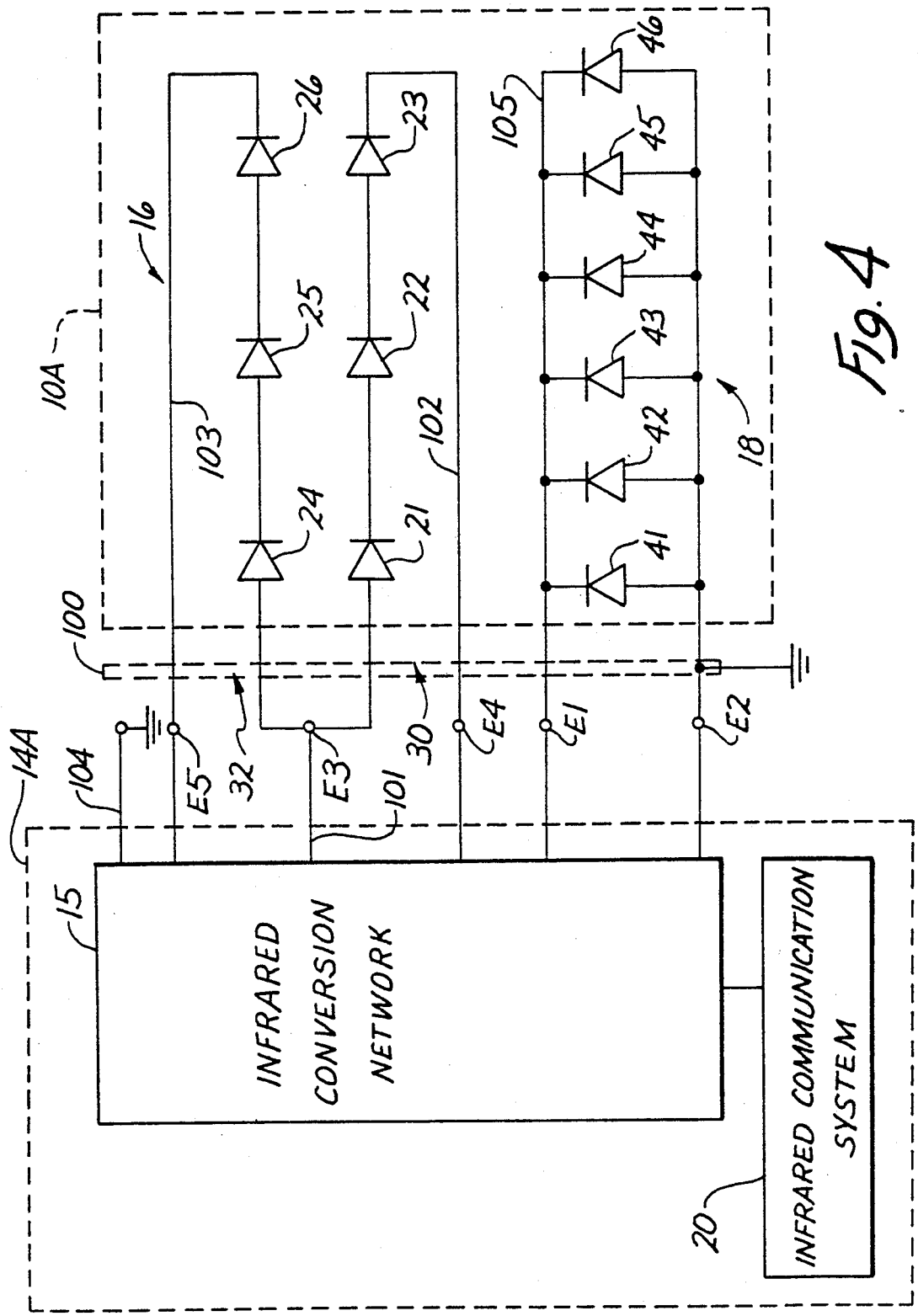
FIG. 4 is a block diagram of the transceiver of FIG. 2.

Considering now the emitter diode array 16 in greater detail with reference to FIG. 4, the emitter diode array 16 in cooperation with the remote transceiver unit 14A transmits infrared lightwave carrier signals via the infrared communication system 20 on a single wavelength carrier in a full duplex mode of operation. In this regard, the emitter diode array 16 contains an array of individual light emitting diodes, which are disposed on the headpiece member 212A of the headset antenna assembly 10A and directed radially outwardly therefrom. The emitter diode array 16 is connected to the remote transceiver unit 14A via a cable 100 for receiving electrical carrier signals from the infrared communication system 20. The infrared communication system 20 modulate the emitter diode array 16 at a given subcarrier frequency.

The remote transceiver unit 14A includes the infrared communication system 20 which transmits and receives subcarrier frequency signals as more fully explained in at least one of the copending patent applications Ser.

Nos. 07/176,939 and 07/326,225. The transmitted subcarrier frequency signals generated via the infrared communication system 20 are coupled to the infrared conversion network 15 and converted into electrical subcarrier signal of a sufficient voltage to cause the subcarrier signals to be modulated onto the lightwave carrier signal produced by the infrared light radiated by the emitter diode array 16.

Considering now the emitter diode array 16 in still greater detail with reference to FIG. 4, the emitter diode array 16 generally comprises a set of individual light emitting diodes 21-26. Diodes 21-26 are connected to the infrared conversion network 15 which causes the diodes to be modulated at the subcarrier frequency Diodes 21-26 are arranged in a pair of diode strings 30 and 32 which are connected together at a common mode E3. Each diode string 30 and 32 contains three diodes which are connected in series. In this regard, diode string 30 includes diodes 21, 22 and 23 while diode string 32 includes diodes 24, 25 and 26. Both diodes strings 30 and 32 are connected to the remote transceiver unit 14A via the cable 100 that includes three signal conductors 101, 102, and 103 and one ground conductor 104. Conductor 101 is connected to node E3 which is common to both diode strings 30 and 32 while conductors 102 and 103 are connected to the opposite terminal ends of each respective diode string 30 and 32 at a pair of other nodes E4 and E5 respectively. Conductor 104 is connected to ground. In the preferred form of the invention, diodes 21-26 are substantially all identical and manufactured by TRW under part number OP293A.

Considering now the receptor diode array 18 in greater detail with reference to FIG. 4, the receptor diode array 18 generally comprises a set of infrared sensitive diodes 41-46 which are connected in parallel between a pair of nodes E1 and E2. Diodes 41-46 are also connected to the remote transceiver unit 14A which demodulates the light carrier signal into a subcarrier frequency signal as well be described herein after in greater detail. Diodes 41-46 are connected in parallel as each diode serves as an independent current source for supplying electrical current to the infrared conversion network 15 of the remote transceiver unit 14A. Diodes 41-46 are biased by a direct current voltage which is coupled through the infrared conversion network 15 to decouple the photodiodes 41-46 from the direct current voltage supply of the system 9A. The infrared conversion network 15 ensures that low-level modulated infrared light from the base station transceiver 9, can be received by the diodes 41-46 even in the presence of a substantially bright ambient light which is not modulated at the subcarrier frequencies generated by system 9. In this regard, the diodes 41-46 are connected to a bias arrangement that is substantially similar to the bias arrangement 81 described in copending patent application Ser. No. 07/427,690 filed on Oct. 27, 1989. As this bias arrangement is substantially similar to the bias arrangement 81 it will not be described hereinafter in greater detail.

Diodes 41-46 are connected to the remote transceiver unit 14 via the cable 100. Cable 100 includes a signal conductor 105 which carries the received transmission signal and a ground conductor 105. Conductor 105 is connected to a common node E1 coupled to the cathodes of each of the diodes 41-46 while conductor 106 is connected to a common node E2 which is coupled to the anodes of each of the diodes 41-46. Node E2 is connected to ground. In the preferred form of the invention diodes 41-46 are substantially all identical and manufactured by Siemens under part number SFH206K.

Considering now the remote transceiver unit 14A in greater detail with reference to FIG. 4, the remote transceiver unit 14A generally comprises the infrared conversion network 15 and the infrared communication system 20. The infrared communicator system 20 is described more fully in copending U.S. patent application 07/176,939 filed Apr. 4, 1988 and 07/326,225 filed Mar. 20, 1989.

Considering now the infrared conversion network 15 in greater detail with reference to FIGS. 4 and 5, the infrared conversion network 15 is connected between the emitter/receptor arrays 16 and 18 and the infrared communication system 12. The infrared conversion network 15 generally comprises a emitter driver network 36, a infrared demodulator network 38 and a direct current low voltage battery 40. The emitter driver network 36 receives the subcarrier electrical frequency signals generated by the infrared communication system 12 and converts the subcarrier signals into electrical signals of an appropriate voltage levels to drive the emitter diode array 16. Conversely, the infrared demodulator network 38 receives the signals generated by the receptor diode array 18 and demodulates the signal into an electrical subcarrier frequency signal for coupling to the infrared communication system 20.

Considering now the emitter driver network 36 in greater detail with reference to FIG. 5, the emitter driver network 36 generally comprises a light emitting diode driver 47 and a current limiting network 40. The light emitting diode driver 47 provides approximately 200 milliamperes of current to each light emitting diode in the emitter diode array 16. In this regard, driver 47 has a fifty percent duty cycle giving an average direct current of 100 milliampers through each light emitting diode 21-26 respectively when the subcarrier frequency generated by the infrared communication system 20 is being transmitted.

When the system 20 is not transmitting a subcarrier signal, the emitter diode array 16 is turned off so no light is being radiated by diodes 21-26.

Considering now the current limiting network 48 in greater detail with reference to FIG. 5, the current limiting network 40 generally comprises a pair of resistors 52 and 53 respectively for limiting the current to diode string 30 and 32 respectively. In this regard, resistor 52 is connected to the cathode of diode string 30 while resistor 53 is connected to the athiode of diode string 32. In the preferred embodiment of the present invention resistors 52 and 53 are each 10 ohm, ¼ watt, 5% resistors.

Considering now the light emitting diode driver 47 in greater detail with reference to FIG. 5, the light emitting diode driver 47 generally comprises a single stage MOS field effect transistor 49 whose drain output is connected to the cathodes of each diode string 30 and 32 through resistors 52 and 53 respectively. Infrared communication system 20 supplies a square wave signal at the desired subcarrier frequency to translator 49 which is frequency modulated to carry audio information. The square wave signal alternates between approximately zero volts and a sufficiently higher voltage to drive transistor 49 to turn the infrared emitting diodes 21-26 on and off at a desired intensity to permit the radiated light signals to be received by a base station antenna associated with system 10.

The source of transistor 49 is connected between a pair of parallel connected polarized capacitor 54 and 55 and a resistor 56 at a node A. Node A is also connected to a common ground conductor that extends between the infrared conversion network 15 and the infrared communication system 20. Resistor 56 is a 1 kohm, ¼ watt resistor. Capacitors 54 and 55 are tantalum capacitor which have their positive terminals connected between the positive terminal of battery 40 and the anodes of each diode string 30 and 32. The negative terminals of capacitor 54 and 55 are connected to the source of transistors 49. In the preferred embodiment of the present invention capacitor 54 is a 33 microfarad, 10 volt capacitor while capacitor 55 is a 0.1 microfarad, 35 volt capacitor.

The gate of transistor 49 is connected to the transmit gate of the infrared communication system 20. In this regard, whenever the transmit gate is enabled the subcarrier frequency signal of the infrared communication system 11 driver transistor 49 on and off for pulsating the emitter diode array 16.

Considering now the battery 40 in greater detail with reference to FIG. 5, battery 40 is a 7.5 volt direct current dry cell battery rated at 750 milliampere of current per hour. In this regard, battery 40 has a life of approximately 12.7 hours and supplies approximately 260 milliamperes of current when the portable antenna 10 is transmitting infrared signals, 45 milliamperes when the antenna 10 is only receiving infrared signals, and 24 milliamperes when the antenna 10 is in a standby mode, waiting to transmit and/or receive infrared signals.

Considering now the infrared demodulator network 38 in greater detail with reference to FIG. 5, the demodulator network 38 is substantially identical to the infrared demodulator network described in copending application Ser. No. 427,690 entitled "Full Duplex Communication System and Method of Using Same."

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. An optical transceiver for use with a second optical transceiver, comprising:
    a headset unit for being worn by a user;
    circuit means mounted to said unit for converting an optical message carrying beam into a message carrying frequency signal and for converting a message carrying frequency signal into an optical message carrying beam;
    said circuit means including emitter means for converting said message carrying frequency signal into an optical message carrying beam for transmission to optical communication base means mounted within a room;
    said circuit means further including receptor means for receiving an optical message carrying beam transmitted by said optical communication base means;
    wall means mounted between said emitter means and said receptor means for preventing the optical message carrying beam transmitted to the optical communication base means from being received by said receptor means, thereby inhibiting feedback interference;
    receptor inclining means for positioning said receptor means upwardly at a sufficient angle relative to the horizontal for helping to prevent line of sight obstruction between said optical communication means and said receptor means; and
    emitter inclining means for positioning said emitter means upwardly at a sufficient angle relative to the horizontal for helping to prevent line of sight obstruction between said optical communication base means and said emitter means.

2. An optical transceiver according to claim 1, wherein said circuit means includes an infrared communication system.

3. An optical transceiver according to claim 1, wherein said receptor means includes at least two infrared receptor devices.

4. An optical transceiver according to claim 1 wherein said emitter means includes at least two infrared emitter devices.

5. An optical transceiver as recited in claim 1, wherein said receptor inclining means and said emitter inclining means respectively incline said receptor means and said emitter means upwardly at sufficient angles relative to the horizontal to permit optical communication with said optical communication base means from substantially any location within a given room as the user means from place to place therein.

6. An optical transceiver as recited in claim 1, wherein said emitter means includes a plurality of light emitting diodes.

7. An optical transceiver as recited in claim 1, wherein said transmission lobe is a half power radiant cone of approximately 54 degrees.

8. An optical transceiver as recited in claim 1, wherein each light emitting diode has a radially outwardly extending peak power axis of optical energy with a transmission lobe of sufficient size and quantity to permit optical communication between said optical communication base means and said light emitting diode from substantially any locale within a given room.

9. An optical transceiver as recited in claim 8, wherein said receptor means includes a plurality of photo diodes.

10. An optical transceiver as recited in claim 8, wherein each photo diode has a radially outwardly extending peak power axis with a reception lobe of sufficient size to permit optical communication between said optical communication base means and said photo diode from substantially any locale within said given room.

11. An optical transceiver as recited in claim 10, wherein said reception lobe is a half power radiant cone of approximately 120 degrees.

12. A method of optical signal communication comprising the steps of:
    positioning an optical antenna assembly on the head of a user, said optical antenna assembly including receptor means and emitter means;
    converting a message carrying frequency signal into an optical message carrying beam for transmission to optical communication base means mounted within a room;
    receiving an optical message carrying beam transmitted by said optical communication base means at a sufficient angle relative to the horizontal for helping to prevent line of sight obstruction between said optical communication means and said receptor means;

transmitting an optical message carrying beam to said optical communication means at a sufficient angle relative to the horizontal for helping to prevent line of sight obstruction between said optical communication means and said emitter means; and preventing the optical message carrying beam transmitted to the optical communication base means for being received by said receptor means thereby inhibiting feedback interference.

13. An optical transceiver for use with a second optical transceiver, comprising:

a headset unit for being worn by a user;

circuit means mounted to said unit for converting an optical message carrying beam into a message carrying frequency signal and for converting a message carrying frequency signal into an optical message carrying beam;

said circuit means including emitter means for converting said message carrying frequency signal into an optical message carrying beam for transmission to optical communication base means mounted within a room;

said circuit means further including receptor means for receiving an optical message carrying beam transmitted by said optical communication base means;

wall means mounted between said emitter means and said receptor means for preventing the optical message carrying beam transmitted to the optical communication base means from being received by said receptor means, thereby inhibiting feedback interference;

inclining means for positioning said receptor means and said emitter means upwardly at different angles relative to the horizontal for optimizing optical transmissions with said base means;

mounting means for positioning said emitter means and said emitter means in an alternating annular configuration on an uppermost portion of said headset unit; and said emitter means and said receptor means including a plurality of individual emitter devices and a plurality of individual receptor devices and further including mounting means for positioning said receptor and emitter devices in an alternating annular configuration.

14. An optical transceiver according to claim 13 wherein said wall means includes a set of upstanding radially extending walls disposed between pairs of individual receptor and emitter devices.

15. An optical transceiver according to claim 14, wherein each one of said walls includes a generally rectangular rear portion and a generally triangular front portion.

16. An optical transceiver according to claim 15, further including an annular base supporting said mounting means, and having an integral upstanding rear wall.

17. An optical transceiver for use with a second optical transceiver, comprising:

a headset unit for being worn by a user;

circuit means mounted to said unit for converting an optical message carrying beam into a message carrying frequency signal and for converting a message carrying frequency signal into an optical message carrying beam;

said circuit means including emitter means for converting said message carrying frequency signal into an optical message carrying beam for transmission to optical communication base means mounted within a room;

said circuit means further including receptor means for receiving an optical message carrying beam transmitted by said optical communication base means;

wall means mounted between said emitter means and said receptor means for preventing the optical message carrying beam transmitted to the optical communication base means from being received by said receptor means, thereby inhibiting feedback interference;

inclining means for positioning said receptor means and said emitter means upwardly at different angles relative to the horizontal for optimizing optical transmissions with said base means;

mounting means for positioning said receptor means and said emitter means in an alternating annular configuration on an uppermost portion of said headset unit; and wherein said emitter means is inclined upwardly relative to the horizontal by an angle of about ten degrees.

18. An optical transceiver for use with a second optical transceiver, comprising:

a headset unit for being worn by a user;

circuit means mounted to said unit for converting an optical message carrying beam into a message carrying frequency signal and for converting a message carrying frequency signal into an optical message carrying beam;

said circuit means including emitter means for converting said message carrying frequency signal into an optical message carrying beam for transmission to optical communication base means mounted within a room;

said circuit means further including receptor means for receiving an optical message carrying beam transmitted by said optical communication base means;

wall means mounted between said emitter means and said receptor means for preventing the optical message carrying beam transmitted to the optical communication base means from being received by said receptor means, thereby inhibiting feedback interference;

inclining means for positioning said receptor means and said emitter means upwardly at different angles relative to the horizontal for optimizing optical transmissions with said base means;

mounting means for positioning said receptor means and said emitter means in an alternating annular configuration on an uppermost portion of said headset unit; and wherein said emitter means has a radially extending axis and a communication lobe of about 54 degrees.

19. An optical transceiver for use with a second optical transceiver, comprising:

a headset unit for being worn by a user;

circuit means mounted to said unit for converting an optical message carrying beam into a message carrying frequency signal and for converting a message carrying frequency signal into an optical message carrying beam;

said circuit means including emitter means for converting said message carrying frequency signal into an optical message carrying beam for transmission to optical communication base means mounted within a room;

said circuit means further including receptor means for receiving an optical message carrying beam transmitted by said optical communication base means;

wall means mounted between said emitter means and said receptor means for preventing the optical message carrying beam transmitted to the optical communication base means from being received by said receptor means, thereby inhibiting feedback interference;

inclining means for positioning said receptor means and said emitter means upwardly at different angles relative to the horizontal for optimizing optical transmissions with said base means;

mounting means for positioning said receptor means and said emitter means in an alternating annular configuration on an uppermost portion of said headset unit; and wherein said receptor means has a radially extending axis and a communication lobe of about 120 degrees.

* * * * *

UNITED STATES PATENT AND TRADEMARK OFFICE
CERTIFICATE OF CORRECTION

PATENT NO. : 5,027,433
DATED : June 25, 1991
INVENTOR(S) : MENADIER

It is certified that error appears in the above-identified patent and that said Letters Patent is hereby corrected as shown below:

Column 5, line 67 after "diode" delete "cf" and substitute therefor --of--.

Column 7, line 15 after "frequency", insert --.--.

Column 10, line 29, delete "means", and substitute therefor ---moves--.

Column 11, line 41, delete "emitter"' and substitute therefor --receptor--.

Signed and Sealed this

Twentieth Day of July, 1993

Attest:

MICHAEL K. KIRK

Attesting Officer     Acting Commissioner of Patents and Trademarks